(12) United States Patent
Kim

(10) Patent No.: US 12,055,861 B2
(45) Date of Patent: Aug. 6, 2024

(54) INSPECTION METHOD, INSPECTION SYSTEM, AND SEMICONDUCTOR FABRICATION USING THE SAME

(71) Applicant: Samsung Electronics Co., Ltd., Suwon-si (KR)

(72) Inventor: Kihyun Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 541 days.

(21) Appl. No.: 17/406,529

(22) Filed: Aug. 19, 2021

(65) Prior Publication Data

US 2022/0197149 A1 Jun. 23, 2022

(30) Foreign Application Priority Data

Dec. 18, 2020 (KR) .................. 10-2020-0178023

(51) Int. Cl.
*H01J 37/28* (2006.01)
*G01N 23/2251* (2018.01)
*G03F 7/00* (2006.01)

(52) U.S. Cl.
CPC ....... *G03F 7/7065* (2013.01); *G01N 23/2251* (2013.01); *G03F 7/70633* (2013.01); *H01J 37/28* (2013.01); *G01N 2223/418* (2013.01); *G01N 2223/6116* (2013.01); *H01J 2237/2817* (2013.01)

(58) Field of Classification Search
CPC .............. G03F 7/7065; G03F 7/70633; G01N 23/2251; G01N 2223/418; G01N 2223/6116; H01J 37/28; H01J 2237/2817
See application file for complete search history.

(56) References Cited

U.S. PATENT DOCUMENTS 5,604,819 A 2/1997 Barnard
6,598,054 B2 7/2003 Schuetze et al.
(Continued)

FOREIGN PATENT DOCUMENTS

WO 2020035285 A1 2/2020

*Primary Examiner* — Hung V Nguyen
(74) *Attorney, Agent, or Firm* — Myers Bigel, P.A.

(57) ABSTRACT

Provided is an inspection method including providing a pattern layout including measurement points, generating a first measurement map including first measurement regions that overlap the measurement points and do not overlap each other in a two-dimensional plan view, providing preliminary measurement regions on the measurement points, producing a polygon by grouping ones of the preliminary measurement regions that overlap each other in the two-dimensional plan view, providing a second measurement region on a center of the polygon, selecting the second measurement region when all of the measurement points in the polygon overlap the second measurement region in the two-dimensional plan view, generating a second measurement map including the selected second measurement region, generating a third measurement map by using the first and second measurement maps, and inspecting patterns on a semiconductor substrate by using the third measurement map. The third measurement map includes the selected second measurement region and ones of the first measurement regions that do not overlap the selected second measurement region in the two-dimensional plan view.

20 Claims, 13 Drawing Sheets

(56) References Cited

U.S. PATENT DOCUMENTS

| | | |
|---|---|---|
| 7,636,156 B2 | 12/2009 | Grueneberg |
| 7,817,844 B2 | 10/2010 | Kitamura et al. |
| 8,041,103 B2 | 10/2011 | Kulkarni et al. |
| 9,189,843 B2 | 11/2015 | Kitamura et al. |
| 9,335,277 B2 | 5/2016 | Nakagaki et al. |
| 10,831,095 B2 * | 11/2020 | Park ................. G01B 15/00 |
| 10,955,742 B2 * | 3/2021 | Seo ..................... G03F 1/36 |
| 11,294,294 B2 * | 4/2022 | Van Haren .......... G03F 7/70783 |
| 11,448,973 B2 * | 9/2022 | Rijpstra .............. G03F 7/70525 |

* cited by examiner

INSPECTION METHOD, INSPECTION SYSTEM, AND SEMICONDUCTOR FABRICATION USING THE SAME

CROSS-REFERENCE TO RELATED APPLICATION

This U.S. nonprovisional application claims priority under 35 U.S.C § 119 to Korean Patent Application No. 10-2020-0178023 filed on Dec. 18, 2020 in the Korean Intellectual Property Office, the disclosure of which is hereby incorporated by reference in its entirety.

BACKGROUND

Embodiments of the present inventive concepts relate to an inspection method, an inspection system, and a semiconductor fabrication method using the same.

Semiconductor devices are widely used in the electronic industry due to their compact size, multi-functionality, and/or low manufacturing cost. Semiconductor devices may be manufactured by various fabrication processes, such as photolithography, etching, deposition, ion implantation, and cleaning. After performing the fabrication processes for manufacturing a semiconductor device, an inspection process may be executed to determine whether defects are present on patterns included in the semiconductor device. Such an inspection process may optimize or improve conditions of the fabrication processes by ascertaining defects of a semiconductor device at an early stage. With the high integration of semiconductor devices, patterns of a semiconductor device may become increasingly finer, which may make the inspection process more difficult.

SUMMARY

Some embodiments of the present inventive concept provide inspection methods and systems capable of reducing time required for inspection of patterns formed on a semiconductor substrate and capable of increasing inspection reliability.

Some embodiments of the present inventive concept provide semiconductor fabrication methods capable of reducing or minimizing the occurrence of defects.

According to some embodiments of the present inventive concept, an inspection method may comprise: providing a pattern layout including a plurality of measurement points; generating a first measurement map including a plurality of first measurement regions that overlap the measurement points in a two-dimensional plan view, wherein the first measurement regions do not overlap each other in the two-dimensional plan view; providing a plurality of preliminary measurement regions on corresponding measurement points; producing a polygon by grouping ones of the preliminary measurement regions, wherein the ones of the preliminary measurement regions overlap each other in the two-dimensional plan view; providing a second measurement region on a center of the polygon; selecting the second measurement region when all of the measurement points in the polygon overlap the second measurement region in the two-dimensional plan view; generating a second measurement map including the selected second measurement region; generating a third measurement map by using the first measurement map and the second measurement map; and inspecting a plurality of patterns formed on a semiconductor substrate by using the third measurement map to. The third measurement map may include the selected second measurement region and ones of the first measurement regions. The ones of the first measurement regions may not overlap the selected second measurement region in the two-dimensional plan view.

According to some embodiments of the present inventive concept, an inspection system may comprise: a stage that is configured to load a semiconductor substrate; an inspection apparatus that is configured to inspect a plurality of patterns formed on the semiconductor substrate; and a computer connected to the inspection apparatus. The computer may be configured to perform operations comprising: providing a pattern layout that corresponds to the patterns; generating a first measurement map including a plurality of first measurement regions that overlap a plurality of measurement points on the pattern layout in a two-dimensional plan view; providing a plurality of preliminary measurement regions on corresponding measurement points; producing a polygon by grouping ones of the preliminary measurement regions, wherein the ones of the preliminary measurement regions overlap each other in the two-dimensional plan view; providing a second measurement region on a center of the polygon; selecting the second measurement region when all of the measurement points in the polygon overlap the second measurement region in the two-dimensional plan view, generating a second measurement map that includes the selected second measurement region; and generating a third measurement map by using the first measurement map and the second measurement map. The inspection apparatus may be configured to use the third measurement map to inspect the patterns on the semiconductor substrate.

According to some embodiments of the present inventive concept, a semiconductor fabrication method may comprise: forming a plurality of patterns on a semiconductor substrate; loading the semiconductor substrate on a stage of an inspection system, the semiconductor substrate having the patterns formed thereon; and inspecting the patterns by using an inspection apparatus of the inspection system. A computer connected to the inspection apparatus may configured to perform operations comprising: providing a pattern layout that corresponds to the patterns; generating a first measurement map including a plurality of first measurement regions that overlap a plurality of measurement points of the pattern layout in a two-dimensional plan view; providing a plurality of preliminary measurement regions on corresponding measurement points; producing a polygon by grouping ones of the preliminary measurement regions, wherein the ones of the preliminary measurement regions overlap each other in the two-dimensional plan view; providing a second measurement region on a center of the polygon; selecting the second measurement region when all of the measurement points in the polygon overlap the second measurement region in the two-dimensional plan view; generating a second measurement map that includes the selected second measurement region; and generating a third measurement map by using the first measurement map and the second measurement map. The inspection apparatus may be configured to inspect the patterns by using the third measurement map generated by the computer.

DETAILED DESCRIPTION OF EMBODIMENTS

The following will now describe in detail some example embodiments of the present inventive concept with reference to the accompanying drawings. Like numeral references refer to like elements, and their repetitive descriptions are omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 1:
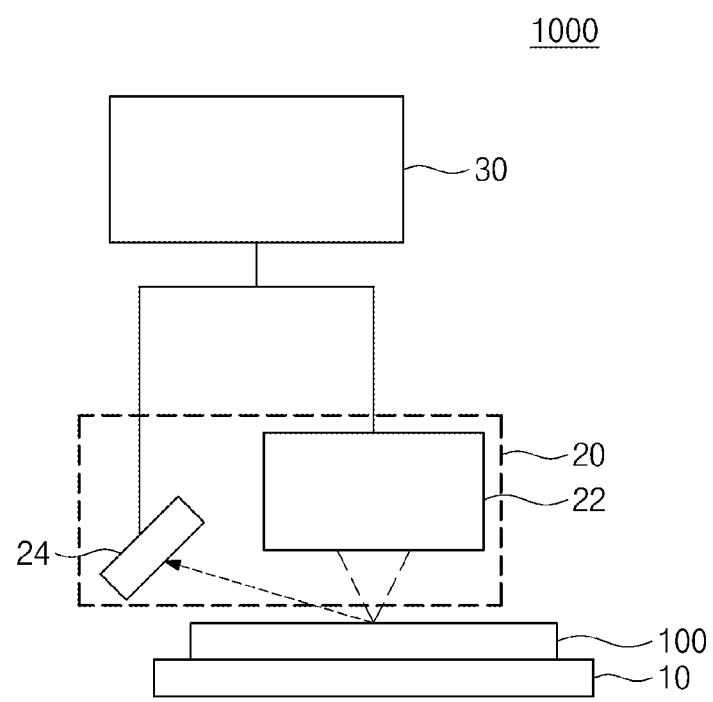
FIG. 1 is a simplified schematic diagram illustrating an inspection system according to some embodiments of the present inventive concept.

FIG. 1 is a simplified schematic diagram illustrating an inspection system according to some embodiments of the present inventive concepts.

Referring to FIG. 1, an inspection system 1000 may include a stage 10 that is configured to load a semiconductor substrate 100, an inspection apparatus 20 that is configured to inspect patterns formed on the semiconductor substrate 100, and a computer 30 connected to the inspection apparatus 20. The inspection apparatus 20 may include a supply section 22 that is configured to irradiate an electronic beam on the semiconductor substrate 100 and a detection section 24 that is configured to detect second electrons emitted from the semiconductor substrate 100. The inspection apparatus 20 may be, for example, a scanning electron microscope (SEM). The inspection apparatus 20 may generate data (e.g., image data of the patterns) related to the patterns by scanning intensity of the secondary electrons emitted from the patterns on the semiconductor substrate 100. The computer 30 may be connected to the supply section 22 and the detection section 24 of the inspection apparatus 20. The computer 30 may provide data to the inspection apparatus 20 and/or may store and process data generated from the inspection apparatus 20.

Figure 2:
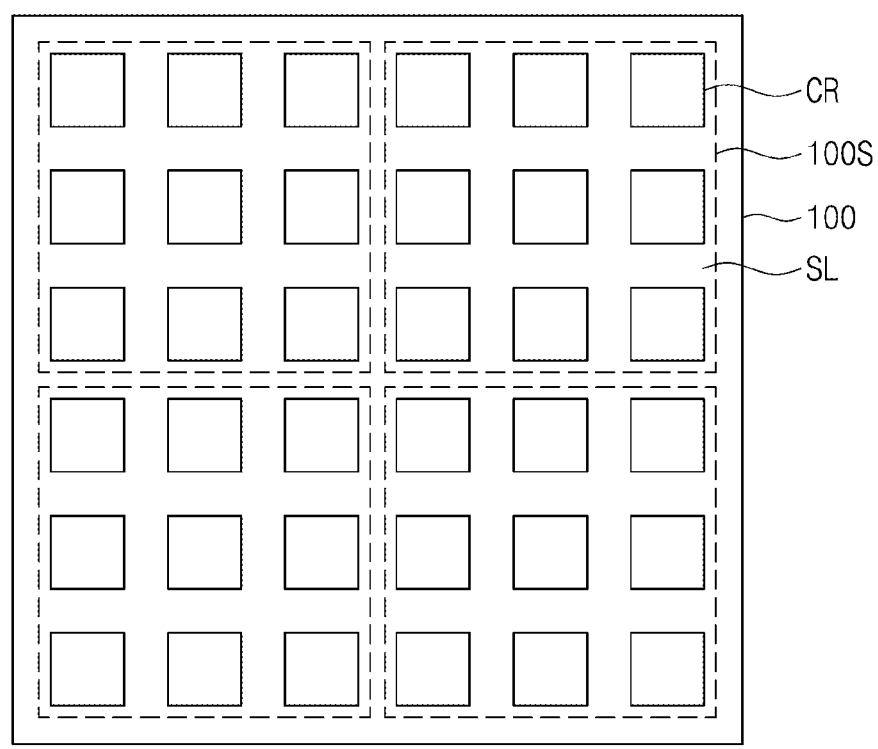
FIG. 2 is a simplified plan view illustrating a semiconductor substrate of FIG. 1.

FIG. 2 is a simplified plan view of the semiconductor substrate 100 depicted in FIG. 1.

Referring to FIG. 2, the semiconductor substrate 100 may include a plurality of chip regions CR and a scribe line SL between the plurality of chip regions CR. The plurality of chip regions CR may include semiconductor devices or semiconductor components (e.g., transistor, capacitor, resistor, and inductor) that are formed to constitute semiconductor integrated circuits. Neighboring ones of the plurality of chip regions CR may be defined as one group 100S (referred to hereinafter as a shot). The neighboring chip regions CR in the shot 100S may be simultaneously exposed when a photolithography process is performed to form the semiconductor components. For example, the number of neighboring chip regions CR defined as one shot 110S may be nine, but embodiments of the present inventive concept are not limited thereto.

The semiconductor substrate 100 may include patterns that are formed on the plurality of chip regions CR and constitute the semiconductor components. With increase in integration of the semiconductor components, the number of the patterns formed on the semiconductor substrate 100 may be increased, and the number of inspection targets of ones of the patterns may also be increased to reduce or minimize defects of the semiconductor components. The following will describe an inspection method in which the inspection system 1000 of FIG. 1 is used to inspect the inspection target patterns according to some embodiments of the inventive concept.

Figure 3:
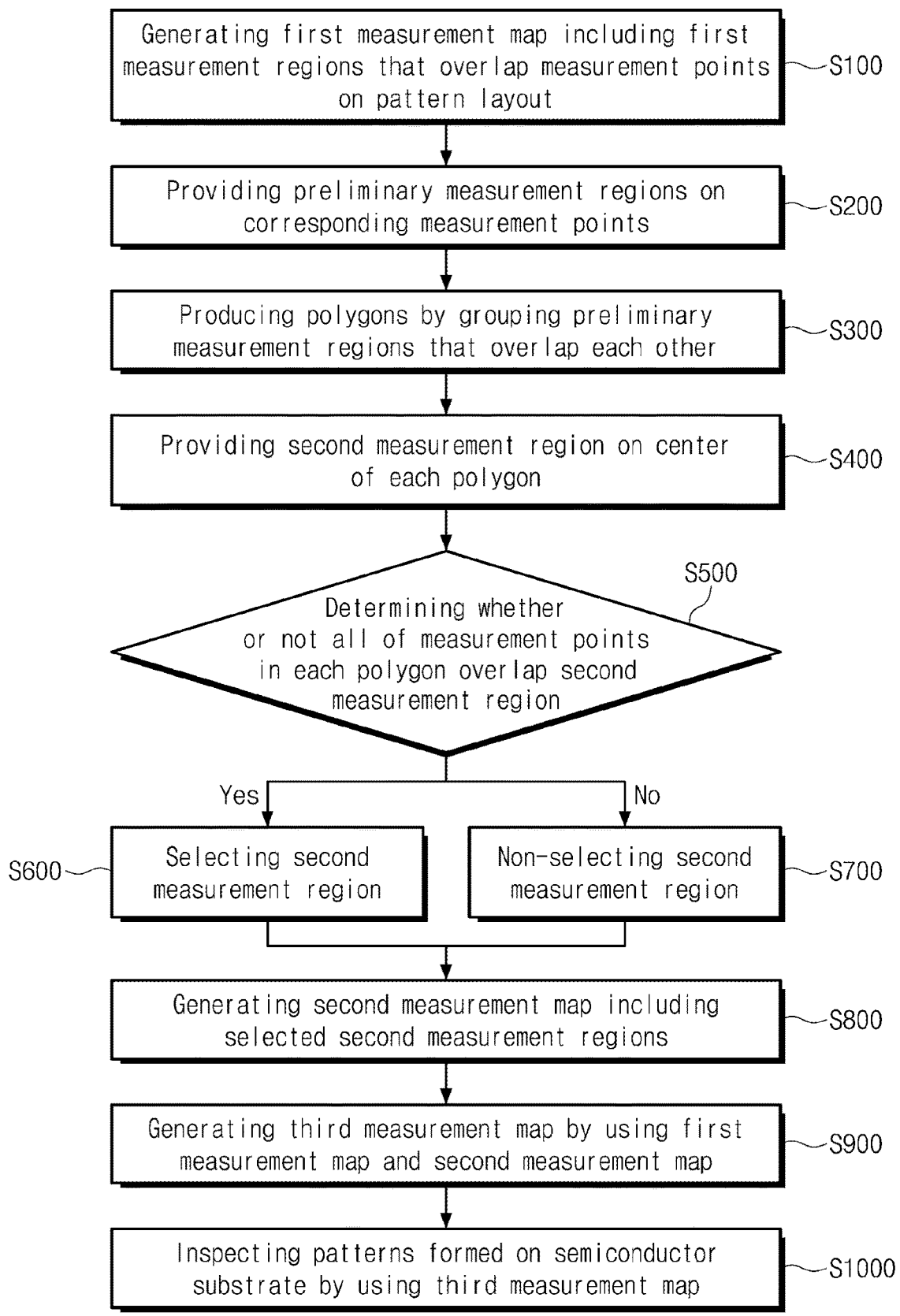
FIG. 3 is a flow chart illustrating an inspection method according to some embodiments of the present inventive concept.
Figure 4:
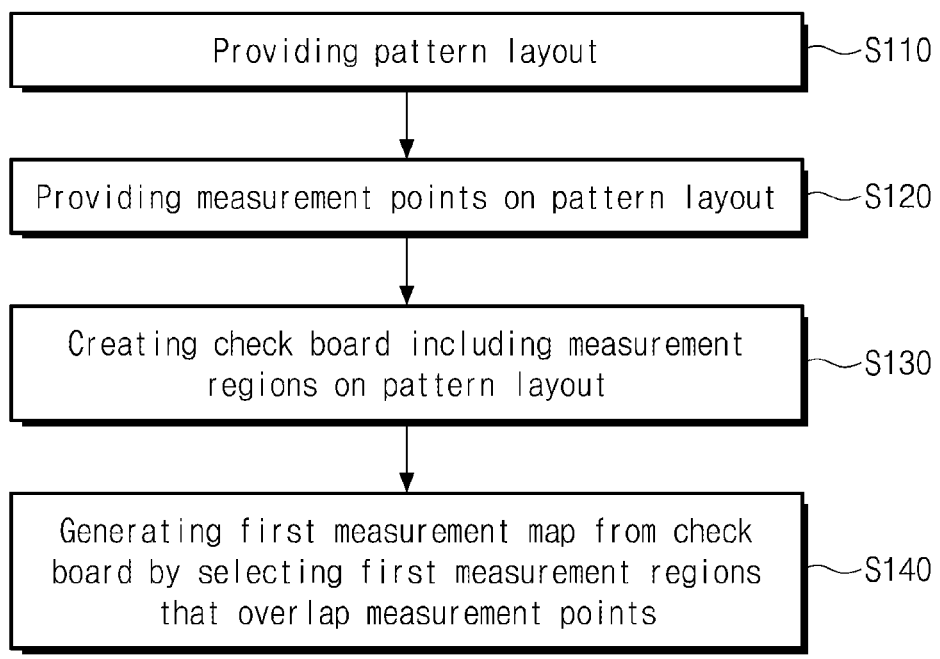
FIG. 4 is a flow chart illustrating a portion of the flow chart of FIG. 3 in greater detail.

FIG. 3 is a flow chart illustrating an inspection method according to some embodiments of the present inventive concepts. FIG. 4 is a flow chart illustrating a portion of FIG. 3 in greater detail. FIGS. 5 to 12 are plan views illustrating an inspection method according to some embodiments of the present inventive concept.

Figure 5:
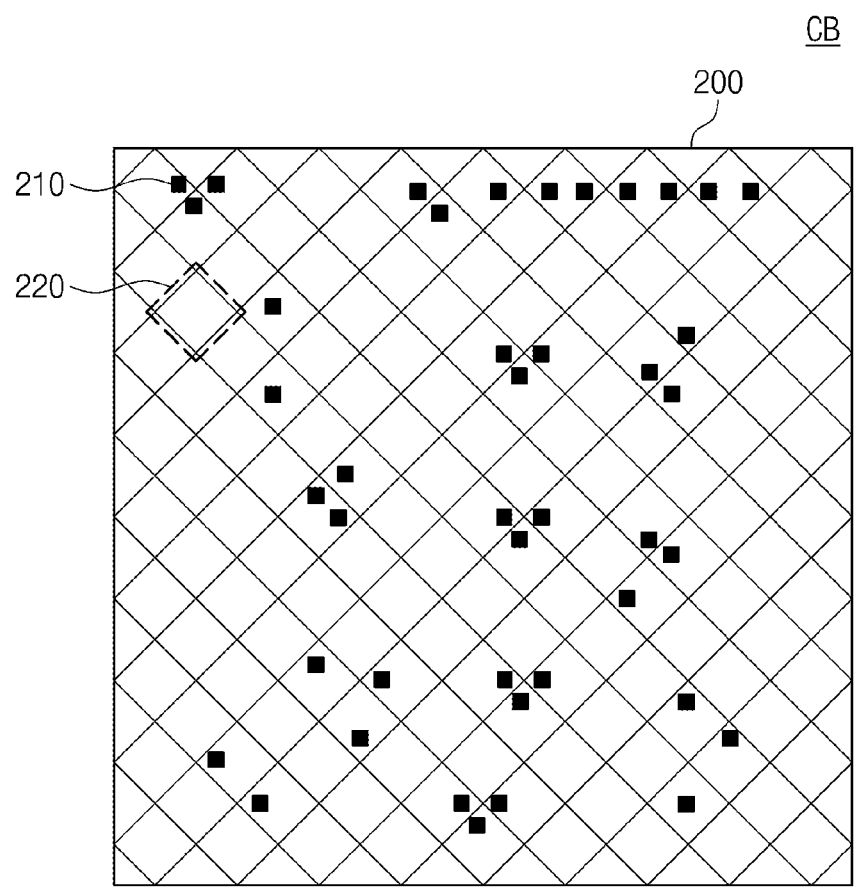
FIGS. 5 to 12 are plan views illustrating an inspection method according to some embodiments of the present inventive concept.

Referring to FIGS. 4 and 5, a pattern layout 200 may be provided. Which defines a planar shape and arrangement of patterns that constitute a semiconductor component (S110). The pattern layout 200 may be a design layout for the patterns. The pattern layout 200 may include design images of the patterns, which will be formed on the plurality of chip regions CR of the semiconductor substrate 100 depicted in FIG. 2. In FIG. 5, design images of the patterns are omitted for brevity of illustration. The pattern layout 200 may be stored in advance in the computer 30 of the inspection system 1000 depicted in FIG. 1.

Measurement points 210 may be provided on the pattern layout 200 (S120). The measurement points 210 may be provided on inspection targets of ones of the patterns that constitute the semiconductor component, and may be provided in polygonal shapes. The computer 30 of FIG. 1 may be configured to provide the pattern layout 200 with the measurement points 210 and to store the pattern layout 200 to which the measurement points 210 are provided.

A check board CB including a plurality of measurement regions 220 may be created on the pattern layout 200 to which the measurement points 210 are provided (S130). Each of the measurement regions 220 may have a planar shape and size that corresponds to that of a field of view (FOV) of the inspection apparatus 20 depicted in FIG. 1. For example, each of the measurement regions 220 may have a rhombic shape. The measurement regions 220 that constitute the check board CB may not overlap each other in the two-dimensional plan view of FIG. 5. The computer 30 of FIG. 1 may create the check board CB on the pattern layout 200 to which the measurement points 210 are provided, and may store the pattern layout 200 to which the check board CB is provided.

Figure 6:
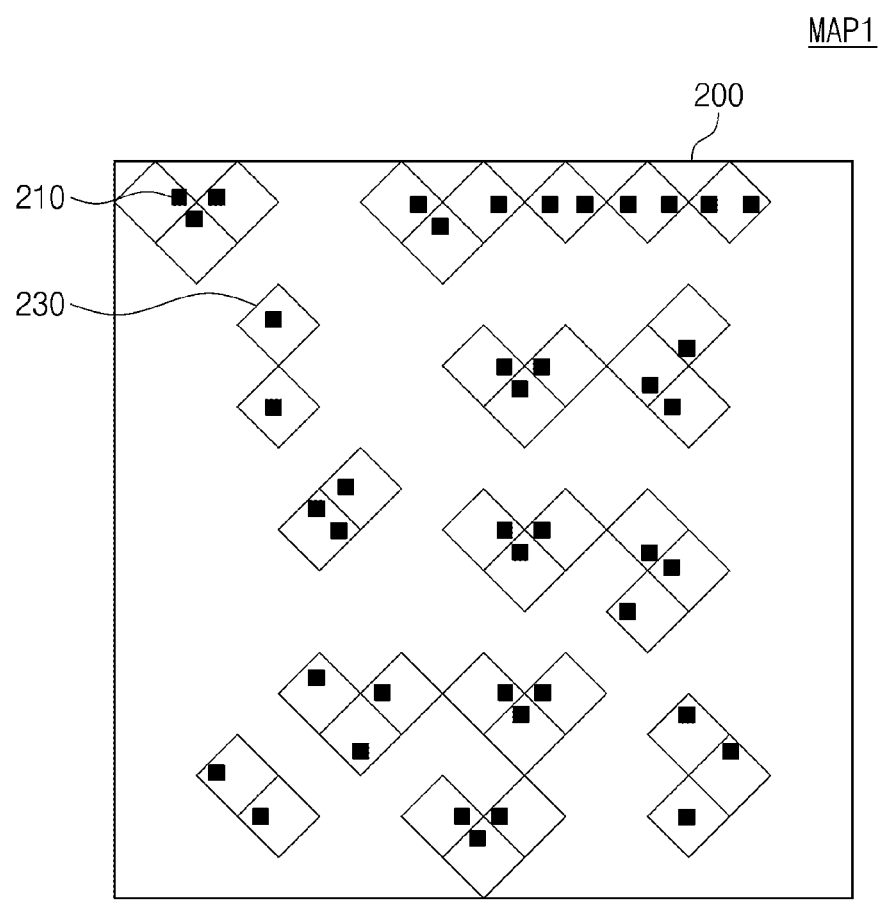

Referring to FIGS. 3, 4, and 6, a first measurement map MAP1 may be generated from the check board CB by selecting first measurement regions 230 that overlap the measurement points 210 in the two-dimensional plan view of FIG. 6 (S140). Among the measurement regions 220 of the check board CB, the measurement regions 220 that overlap the measurement points 210 may be defined as or refer to the first measurement regions 230. The selection of the first measurement regions 230 from the check board CB may generate the first measurement map MAP1 including the first measurement regions 230 that overlap the measurement points 210 on the pattern layout 200 (S100). Each of the first measurement regions 230 may have a planar shape and size that corresponds to that of the field of view (FOV) of the inspection apparatus 20 depicted in FIG. 1. Each of the first measurement regions 230 may have, for example, a rhombic shape. No overlap in the two-dimensional plan view of FIG. 6 may be present between the first measurement regions 230 that constitute the first measurement map MAP1. The computer 30 of FIG. 1 may generate the first measurement map MAP1 including the first measurement regions 230 that overlap the measurement points 210 on the pattern layout 200, and may store the first measurement map MAP1.

Figure 7:
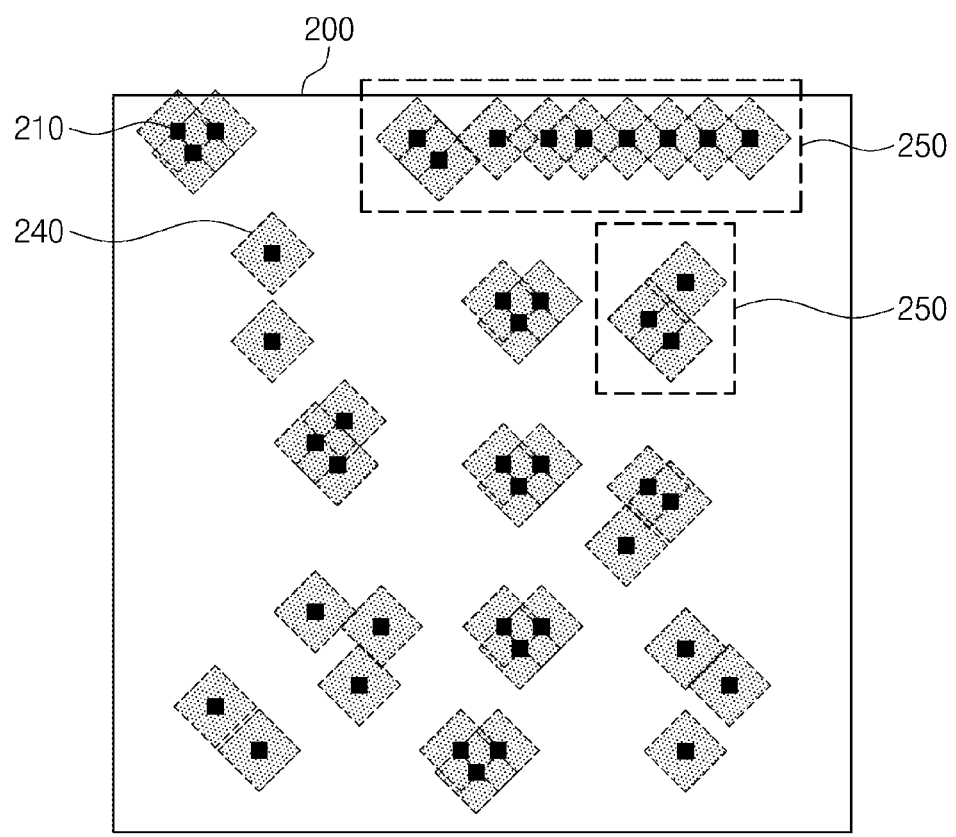

Referring to FIGS. 3 and 7, preliminary measurement regions 240 may be correspondingly provided on the measurement points 210 of the pattern layout 200 (S200). Each of the preliminary measurement regions 240 may have a planar shape and size that corresponds to that of the field of view (FOV) of the inspection apparatus 20 depicted in FIG. 1. Each of the preliminary measurement regions 240 may have, for example, a rhombic shape. The measurement points 210 may be correspondingly disposed on centers of the preliminary measurement regions 240. Therefore, an overlap may be provided between the preliminary measurement regions 240 disposed on neighboring ones of the measurement points 210 in the two-dimensional plan view of FIG. 7. The overlapped ones of the preliminary measurement regions 240 may be grouped to produce a plurality of polygons 250 on the pattern layout 200 (S300). The computer 30 of FIG. 1 may be configured such that the preliminary measurement regions 240 may be provided on the measurement points 210 of the pattern layout 200, and that overlapped ones of the preliminary measurement regions 240 may be grouped to produce the plurality of polygons 250 on the pattern layout 200.

Figure 8:
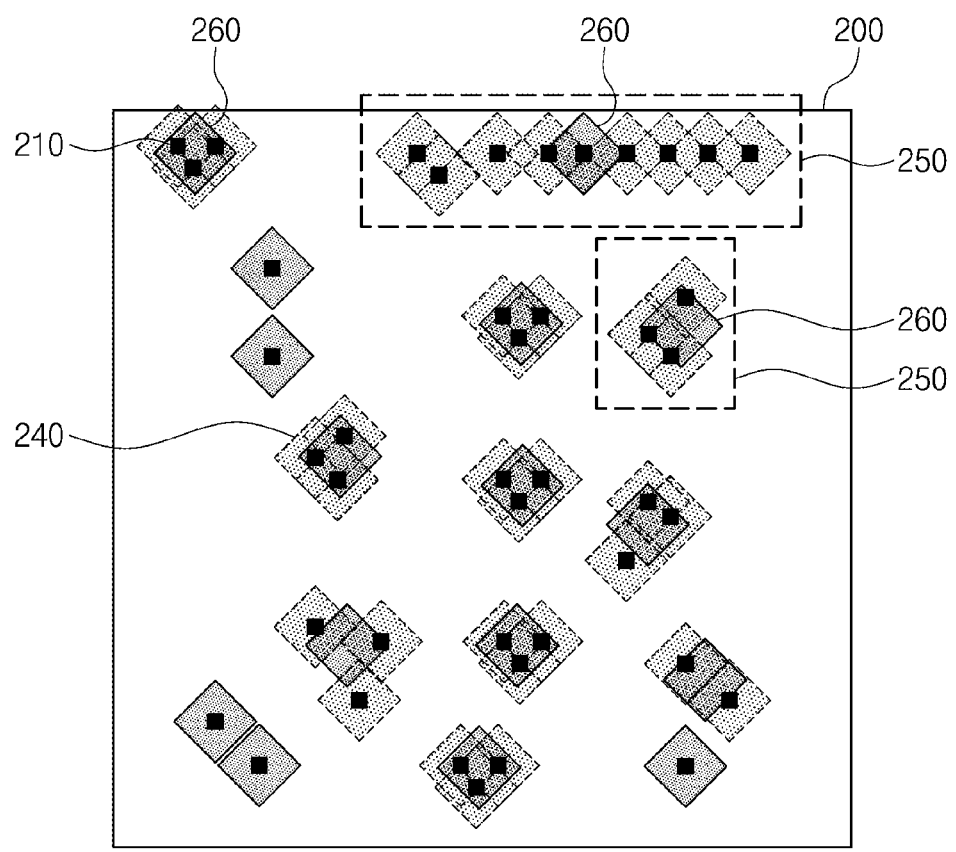

Referring to FIGS. 3 and 8, second measurement regions 260 may be correspondingly provided on centers of the plurality of polygons 250 (S400). The second measurement regions 260 may be correspondingly disposed on the centers of the plurality of polygons 250. Each of the second measurement regions 260 may have a planar shape and size that corresponds to that of the field of view (FOV) of the inspection apparatus 20 depicted in FIG. 1. Each of the second measurement regions 260 may have, for example, a rhombic shape. The plurality of measurement regions 220, the first measurement regions 230, the preliminary measurement regions 240, and the second measurement regions 260 on the check board CB may have about the same planar shape and the same size. Each of the plurality of measurement regions 220, the first measurement regions 230, the preliminary measurement regions 240, and the second measurement regions 260 on the check board CB may correspond to the field of view (FOV) of the inspection apparatus 20 depicted in FIG. 1 and may have, for example, a rhombic shape. The computer 30 of FIG. 1 may be configured to provide the second measurement regions 260 on corresponding centers of the plurality of polygons 250.

Figure 9:
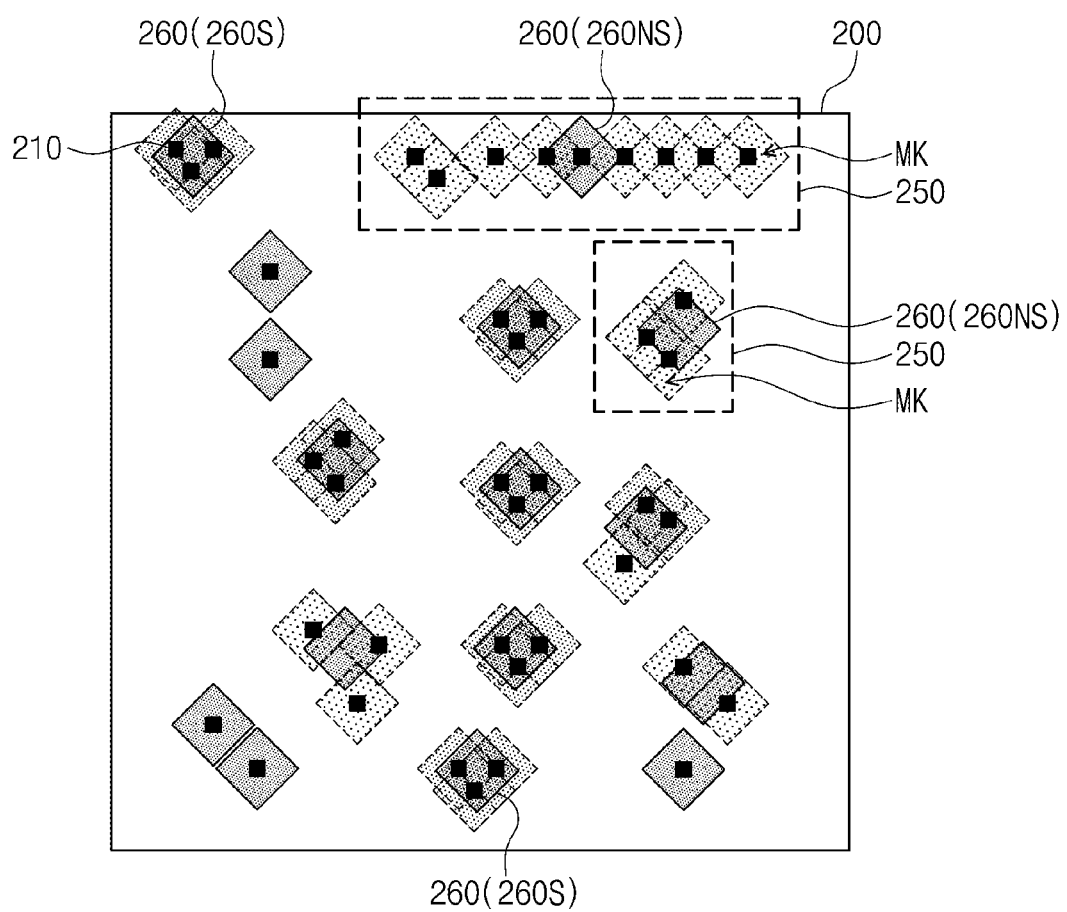

Referring to FIGS. 3 and 9, it may be determined whether all of the measurement points 210 in each of the plurality of polygons 250 overlap a corresponding second measurement region 260 (S500) in the two-dimensional plan view of FIG. 9. For example, regarding each of the plurality of polygons 250, it may be determined whether all of the measurement points 210 are present within a corresponding second measurement region 260. When all of the measurement points 210 in each polygon 250 overlap (or are present within) a corresponding second measurement region 260 in the two-dimensional plan view of FIG. 9, the computer 30 of FIG. 1 may select the corresponding second measurement region 260 or 260S (S600). When at least a portion of the measurement points 210 in each polygon 250 deviates from (or is present outside) a corresponding second measurement region 260, the computer 30 of FIG. 1 may not select the corresponding second measurement region 260 or 260NS (S700). When the corresponding second measurement region 260NS is not selected, the computer 30 of FIG. 1 may provide a marker MK to the polygon 250 that overlaps the non-selected second measurement region 260NS in the two-dimensional plan view of FIG. 9.

Figure 10:
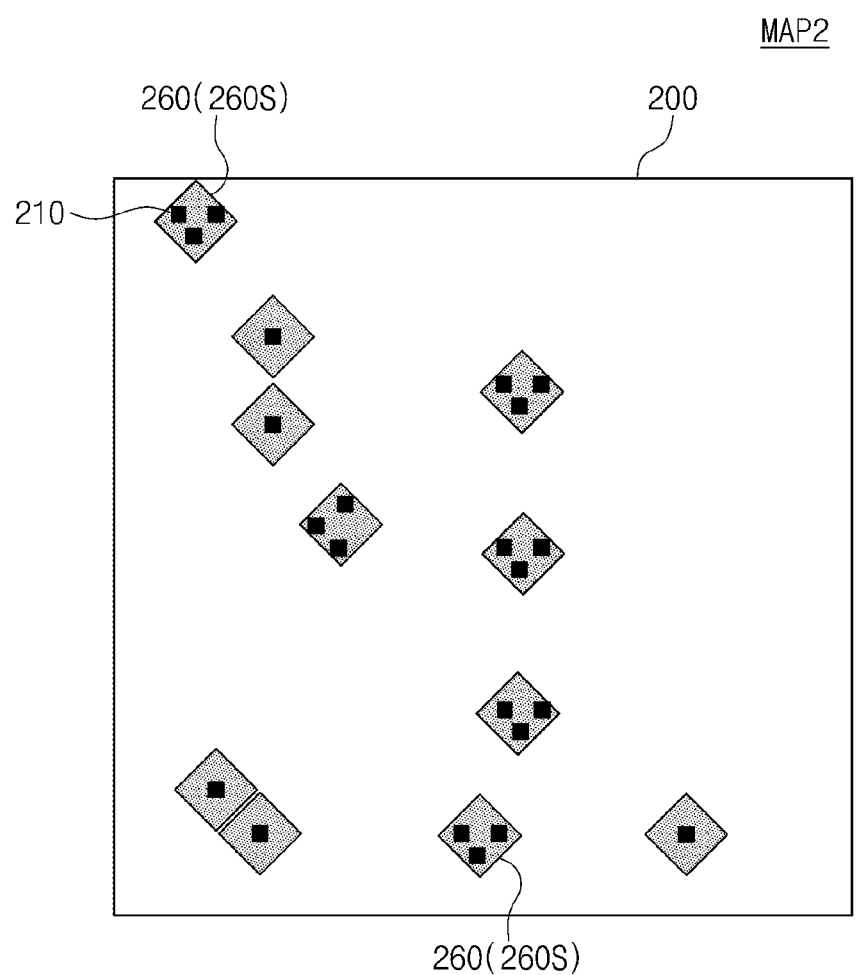

Referring to FIGS. 3 and 10, a second measurement map MAP2 may be generated, which includes the selected second measurement regions 260S of the second measurement regions 260 (S800). The generation of the second measurement map MAP2 may include removing the non-selected second measurement regions 260NS from the second measurement regions 260. The removal of the non-selected second measurement regions 260NS may include, for example, removing the second measurement regions 260 that overlap the polygons 250 to each of which the marker MK is provided in the two-dimensional plan view of FIG. 9. The computer 30 of FIG. 1 may remove the non-selected second measurement regions 260NS from the second measurement regions 260, and may generate and store the second measurement map MAP2 that includes the selected second measurement regions 260S.

Figure 11:
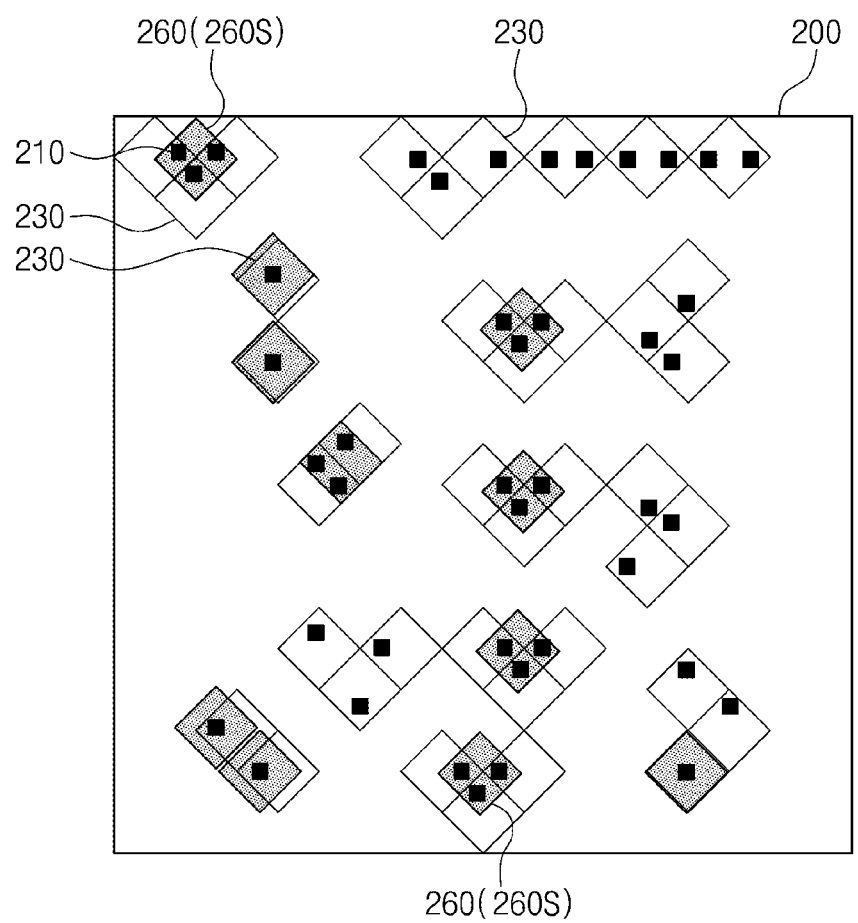
Figure 12:
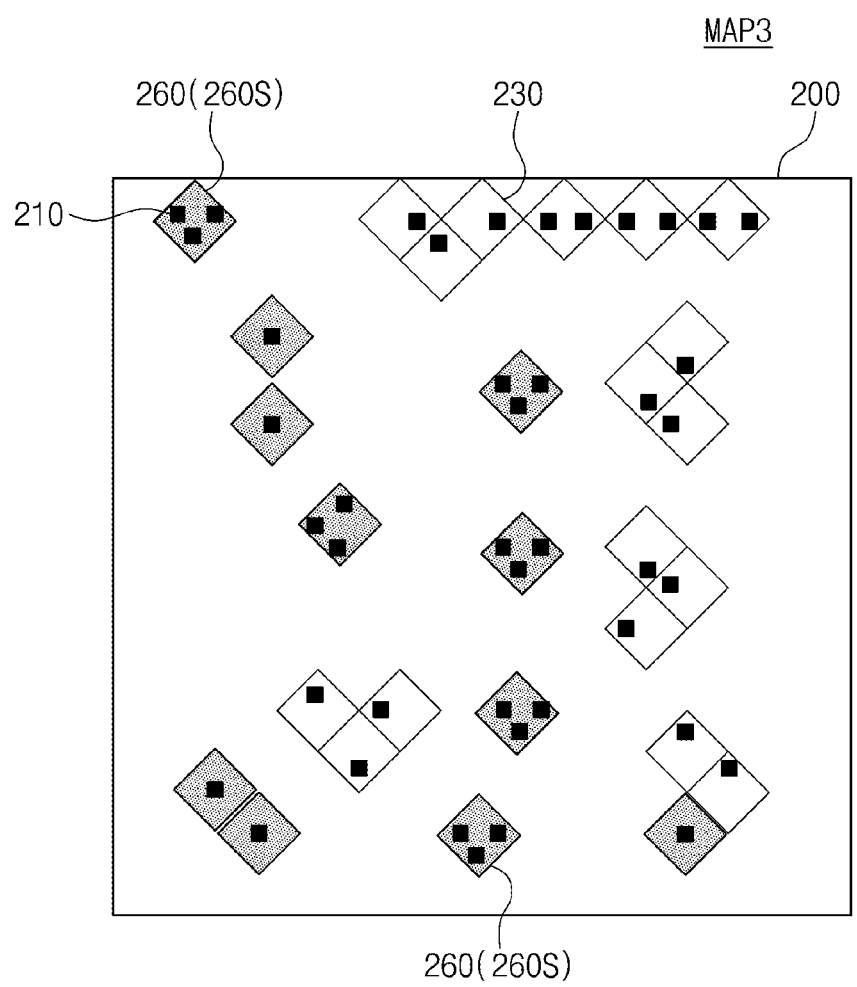

Referring to FIGS. 3, 11, and 12, the first measurement map MAP1 and the second measurement map MAP2 may be used to generate a third measurement map MAP3 (S900). The generation of the third measurement map MAP3 may include allowing the second measurement map MAP2 to overlap the first measurement map MAP1 to provide the selected second measurement regions 260S on the first measurement regions 230 (two-dimensional plan view of FIG. 11), and removing the first measurement regions 230 of the first measurement map MAP1 that overlap the selected second measurement regions 260S of the second measurement map MAP2 (two-dimensional plan view of FIG. 12). The third measurement map MAP3 may include the selected second measurement regions 260S and the first measurement regions 230 that do not overlap the selected second measurement regions 260S.

The computer 30 of FIG. 1 may configured to overlap the first measurement map MAP1 with the second measurement map MAP2 by overlaying the second measurement map MAP2 onto the first measurement map MAP1 on the pattern layout 200, to remove the first measurement regions 230 of the first measurement map MAP1 that overlap the selected second measurement regions 260S of the second measurement map MAP2, and to generate the third measurement map MAP3 including the selected second measurement regions 260S and the first measurement regions 230 that do not overlap the selected second measurement regions 260S. As the first measurement regions 230 of the first measurement map MAP1 that overlap the selected second measurement regions 260S are removed, the third measurement map MAP3 may include measurement regions that are reduced from those of the first measurement map MAP1.

The computer 30 of FIG. 1 may provide the third measurement map MAP3 to the inspection apparatus 20 of FIG. 1, and the inspection apparatus 20 may use the third measurement map MAP3 to inspect patterns formed on the semiconductor substrate 100 of FIG. 1 (S1000). Each of the measurement regions 260S and 230 of the third measurement map MAP3 may correspond to the field of view (FOV) of the inspection apparatus 20 and may have, for example, a rhombic shape. The inspection apparatus 20 may use the third measurement map MAP3 to inspect patterns (or inspection target patterns) that correspond to the measurement points 210.

With high integration of semiconductor components and fineness of patterns that constitute the semiconductor components, there may be an increase in the number of the measurement points 210 on the pattern layout 200. In this case, the inspection apparatus 20 may increase the time used to inspect the measurement points 210, and may repeatedly inspect neighboring measurement points 210.

According to embodiments of the present inventive concepts, the third measurement map MAP3 may include the selected second measurement regions 260S and the first measurement regions 230 that do not overlap the selected second measurement regions 260S. The third measurement map MAP3 may include a reduced number of measurement regions including the selected second measurement regions 260S and first measurement regions 230 relative to the first measurement MAP1 due to removal of some of the first measurement regions 230, and thus the inspection apparatus 20 may need less time to inspect patterns that correspond to the measurement points 210. Moreover, neighboring ones of the measurement points 210 may be present within a corresponding one of the measurement regions 260S and 230 of the third measurement map MAP3. A duplicate inspection of neighboring measurement points 210 may thus be avoided.

Accordingly, it may be possible to reduce the time used to inspect patterns formed on the semiconductor substrate 100 and to provide inspection methods and systems capable of increasing inspection reliability.

Figure 13:
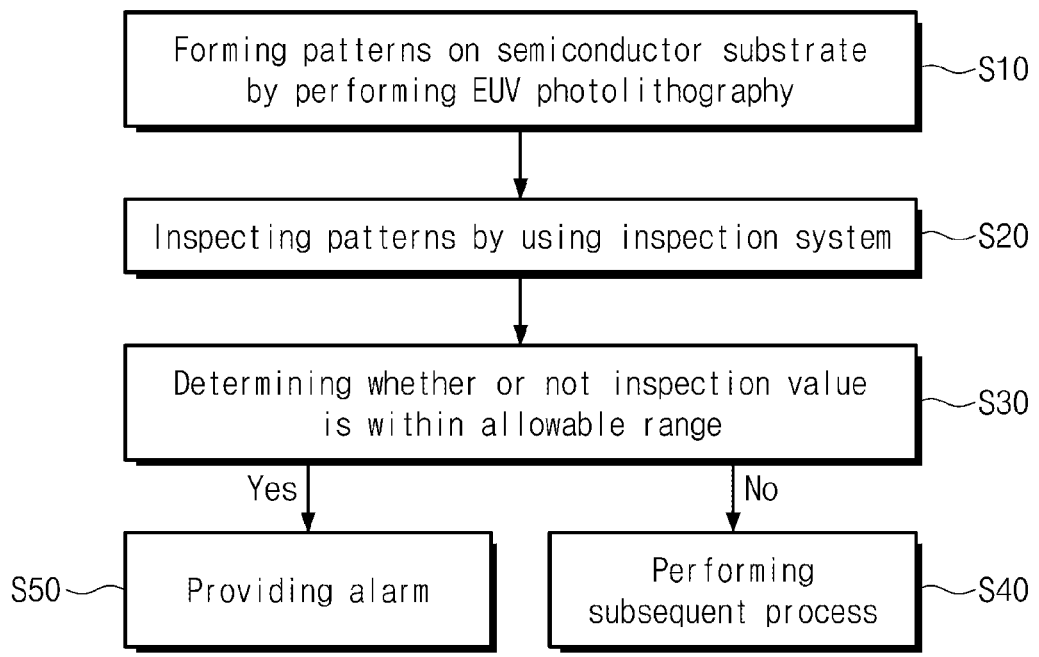
FIG. 13 is a flow chart illustrating a semiconductor fabrication method according to some embodiments of the present inventive concept.

FIG. 13 is a flow chart illustrating a semiconductor fabrication method according to some embodiments of the present inventive concept.

Referring to FIG. 13, a photolithography process using an extreme ultraviolet (EUV) radiation may be performed to form patterns on the semiconductor substrate 100 described with reference to FIG. 2 (S10). The patterns may be formed on the plurality of chip regions CR of the semiconductor substrate 100, and the photolithography process may simultaneously expose neighboring chip regions CR in a single shot 100S. The photolithography process may transfer the pattern layout 200, described with reference to FIG. 3, onto the plurality of chip regions CR of the semiconductor substrate 100.

In this description, the EUV may mean an ultraviolet ray having a wavelength of about 4 nm to about 124 nm, in other embodiments about 4 nm to about 20 nm, and in still other embodiments about 13.5 nm. The EUV may denote light whose energy is in the range of about 6.21 eV to about 124 eV, and in other embodiments of about 90 eV to about 95 eV. The photolithography process using the EUV may include exposure and development processes that use the EUV irradiated onto a photoresist layer on the semiconductor substrate 100. For example, the photoresist layer may be an organic photoresist that contains an organic polymer, such as polyhydroxystyrene. The organic photoresist may further include a photosensitive compound sensitive to the EUV. The organic photoresist may additionally include a material whose EUV absorption coefficient is generally high, for example, an organometallic material, an iodine-containing material, or a fluorine-containing material. For another example, the photoresist layer may be an inorganic photoresist that contains an inorganic material, such as tin oxide.

The photoresist layer may be formed to have a relatively small thickness. The photoresist layer exposed to the EUV may be developed to form photoresist patterns on the semiconductor substrate 100. When viewed in plan, the photoresist patterns may each have a linear shape that extends in one direction, an island shape, a zigzag shape, a honeycomb shape, or a circular shape, but embodiments of the present inventive concept are not limited to a particular example. The photoresist patterns may have a planar shape and size that corresponds to that of designed images of the patterns.

The photoresist patterns may be used as an etching mask to pattern one or more mask layers that are stacked below the photoresist patterns, and thus mask patterns may be formed. The mask patterns may be used as an etching mask to pattern a target layer to form the patterns on the semiconductor substrate 100.

As a comparative example of the embodiments of the present inventive concept, a multi-patterning technique (MPT) may use two or more photomasks to form fine-pitched patterns on a wafer. In contrast, when the EUV photolithography process is performed, according to some embodiments of the present inventive concept, even a single photomask may be enough to form the patterns having a fine pitch. For example, a value equal to or less than about 45 nm may be given as a minimum pitch between the patterns that are achieved by the EUV photolithography process according to the some embodiments of the incentive concept. The EUV photolithography process may be performed to form sophisticated and find patterns even without the multi-patterning technique.

After the formation of the patterns on the semiconductor substrate 100, the inspection system 1000 of FIG. 1 may be used to inspect the patterns (S20). The semiconductor substrate 100 on which the patterns are formed may be loaded on the stage 10 of the inspection system 1000, and the inspection apparatus 20 of the inspection system 1000 may be used to inspect the patterns on the semiconductor substrate 100. The inspection system 1000 may be used to detect defects and/or to measure dimensions of the patterns formed on the semiconductor substrate 100. The inspection system 1000 may inspect the patterns on the semiconductor substrate 100 by using one or more embodiments of the inspection method described above with reference to FIGS. 3 to 12.

It may be determined whether an inspection value based on inspection results of the inspection system 1000 is present within an allowable range (S30). When the inspection value is outside the allowable range, an alarm may be provided (S40), and when the inspection value is within the allowable range, a subsequent process may be performed on the semiconductor substrate 100.

According to embodiments of the present inventive concept, the patterns on the semiconductor substrate 100 may be formed by performing a photolithography process that uses an extreme ultraviolet (EUV) radiation, and may be inspected by using one or more embodiments of the inspection method and system described with reference to FIGS. 1 to 12. In this case, inspection time of the patterns may be reduced, and defects of the patterns may be detected. As a result, it may be possible to reduce or minimize defects of semiconductor components formed by using the patterns. Therefore, embodiments of the present inventive concept may provide a semiconductor fabrication method capable of reducing or minimizing the occurrence of defects.

According to embodiments of the present inventive concepts, it may be possible to reduce the time used to inspect patterns formed on a semiconductor substrate and to increase reliability of inspection. Hence, defects possibly occurring on the patterns may be reduced or minimized during fabrication processes for forming the patterns on the semiconductor substrate.

The aforementioned description provides some example embodiments for describing the present inventive concept. Therefore, the present inventive concept is not limited to the embodiments described above, and it will be understood by one of ordinary skill in the art that variations in form and detail may be made therein without departing from the spirit and essential features of the present inventive concept.

What is claimed is:

1. An inspection method, comprising:
providing a pattern layout including a plurality of measurement points;
generating a first measurement map including a plurality of first measurement regions that overlap the measurement points in a two-dimensional plan view, wherein the first measurement regions do not overlap each other in the two-dimensional plan view;
providing a plurality of preliminary measurement regions on corresponding measurement points;
producing a polygon by grouping ones of the preliminary measurement regions, wherein the ones of the preliminary measurement regions overlap each other in the two-dimensional plan view;
providing a second measurement region on a center of the polygon;
selecting the second measurement region when all of the measurement points in the polygon overlap the second measurement region in the two-dimensional plan view;
generating a second measurement map including the selected second measurement region;
generating a third measurement map by using the first measurement map and the second measurement map; and
inspecting a plurality of patterns formed on a semiconductor substrate by using the third measurement map,
wherein the third measurement map includes the selected second measurement region and ones of the first measurement regions, the ones of the first measurement regions not overlapping the selected second measurement region in the two-dimensional plan view.

2. The inspection method of claim 1, wherein generating the first measurement map includes:
creating a check board including a plurality of measurement regions on the pattern layout, wherein the plurality of measurement regions do not overlap each other in the two-dimensional plan view; and
selecting the first measurement regions among the plurality of measurement regions, wherein the first measurement regions overlap the measurement points in the two-dimensional plan view.

3. The inspection method of claim 1, wherein the measurement points correspond to centers of the preliminary measurement regions.

4. The inspection method of claim 1, wherein the first measurement regions, the preliminary measurement regions, and the second measurement region have a same planar shape and a same size.

5. The inspection method of claim 1, wherein inspecting the patterns formed on the semiconductor substrate is performed by an inspection apparatus that uses the third measurement map,
wherein the first measurement regions, the preliminary measurement regions, and the second measurement region each correspond to a field of view (FOV) of the inspection apparatus.

6. The inspection method of claim 5, wherein the inspection apparatus includes a scanning electron microscope.

7. The inspection method of claim 1, further comprising non-selecting the second measurement region when at least a portion of the measurement points in the polygon deviates from the second measurement region.

8. The inspection method of claim 1, wherein generating the third measurement map includes:
overlaying the first measurement map and the second measurement map to provide the selected second measurement region on the first measurement regions; and
removing ones of the first measurement regions, wherein the ones of the first measurement regions overlap the selected second measurement region in the two-dimensional plan view.

9. An inspection system, comprising:
a stage that that is configured to load a semiconductor substrate;
an inspection apparatus that is configured to inspect a plurality of patterns formed on the semiconductor substrate; and
a computer connected to the inspection apparatus,
wherein the computer is configured to perform operations comprising:
providing a pattern layout that corresponds to the patterns;
generating a first measurement map including a plurality of first measurement regions that overlap a plurality of measurement points on the pattern layout in a two-dimensional plan view;
providing a plurality of preliminary measurement regions on corresponding measurement points;
producing a polygon by grouping ones of the preliminary measurement regions, wherein the ones of the preliminary measurement regions overlap each other in the two-dimensional plan view;
providing a second measurement region on a center of the polygon;
selecting the second measurement region when all of the measurement points in the polygon overlap the second measurement region in the two-dimensional plan view;
generating a second measurement map that includes the selected second measurement region; and
generating a third measurement map by using the first measurement map and the second measurement map, and
wherein the inspection apparatus is configured to use the third measurement map to inspect the patterns on the semiconductor substrate.

10. The inspection system of claim 9, wherein the first measurement regions, the preliminary measurement regions, and the second measurement region each correspond to a field of view (FOV) of the inspection apparatus.

11. The inspection system of claim 10, wherein the inspection apparatus includes a scanning electron microscope.

12. The inspection system of claim 9, wherein the first measurement regions, the preliminary measurement regions, and the second measurement region have a same planar shape and a same size.

13. The inspection system of claim 9, wherein the operations further comprise:
creating a check board that includes a plurality of measurement regions on the pattern layout, and
generating the first measurement map by selecting the first measurement regions among the plurality of measurement regions, wherein the selected first measurement regions overlap the measurement points in the two-dimensional plan view,
wherein the plurality of measurement regions do not overlap each other in the two-dimensional plan view.

14. The inspection system of claim 9, wherein the operations further comprise:
   providing the preliminary measurement regions so that the measurement points correspond to centers of the preliminary measurement regions.

15. The inspection system of claim 9, wherein the operations further comprise:
   non-selecting the second measurement region when at least a portion of the measurement points in the polygon deviates from the second measurement region.

16. The inspection system of claim 9, wherein the operations further comprise:
   providing the selected second measurement region on the first measurement regions by overlaying the first measurement map and the second measurement map onto each other, and
   generating the third measurement map by removing ones of the first measurement regions, wherein the ones of the first measurement regions overlap the selected second measurement region in the two-dimensional plan view.

17. The inspection system of claim 16, wherein the third measurement map includes the selected second measurement region and ones of the first measurement regions, wherein the ones of the first measurement regions do not overlap the selected second measurement region in the two-dimensional plan view.

18. A semiconductor fabrication method, comprising:
   forming a plurality of patterns on a semiconductor substrate;
   loading the semiconductor substrate on a stage of an inspection system, the semiconductor substrate having the patterns formed thereon; and
   inspecting the patterns by using an inspection apparatus of the inspection system,
   wherein a computer connected to the inspection apparatus is configured to perform operations comprising:
   providing a pattern layout that corresponds to the patterns;
   generating a first measurement map including a plurality of first measurement regions that overlap a plurality of measurement points of the pattern layout in a two-dimensional plan view;
   providing a plurality of preliminary measurement regions on corresponding measurement points;
   producing a polygon by grouping ones of the preliminary measurement regions, wherein the ones of the preliminary measurement regions overlap each other in the two-dimensional plan view;
   providing a second measurement region on a center of the polygon;
   selecting the second measurement region when all of the measurement points in the polygon overlap the second measurement region in the two-dimensional plan view;
   generating a second measurement map that includes the selected second measurement region; and
   generating a third measurement map by using the first measurement map and the second measurement map, and
   wherein the inspection apparatus is configured to inspect the patterns by using the third measurement map generated by the computer.

19. The semiconductor fabrication method of claim 18, wherein forming the patterns includes performing a photolithography process that uses an extreme ultraviolet radiation.

20. The semiconductor fabrication method of claim 18, wherein the third measurement map includes the selected second measurement region and ones of the first measurement regions, wherein the ones of the first measurement regions do not overlap the selected second measurement region in the two-dimensional plan view.

* * * * *